(12) United States Patent
Kim et al.

(10) Patent No.: US 8,895,392 B2
(45) Date of Patent: Nov. 25, 2014

(54) METHOD FOR FABRICATING SEMICONDUCTOR DEVICE

(71) Applicant: SK hynix Inc., Gyeonggi-do (KR)

(72) Inventors: Tae-Yoon Kim, Gyeonggi-do (KR); Heung-Jae Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 35 days.

(21) Appl. No.: 13/720,059

(22) Filed: Dec. 19, 2012

(65) Prior Publication Data

US 2014/0024214 A1 Jan. 23, 2014

(30) Foreign Application Priority Data

Jul. 17, 2012 (KR) .................. 10-2012-0077779

(51) Int. Cl.
*H01L 21/336* (2006.01)
*H01L 21/02* (2006.01)

(52) U.S. Cl.
CPC .............................. *H01L 21/02697* (2013.01)
USPC .............. 438/268; 257/E21.41; 257/E21.627; 257/E21.629; 438/270; 438/672; 438/675

(58) Field of Classification Search
USPC .................... 257/E21.41, E21.627, E21.629; 438/270, 672, 675
See application file for complete search history.

(56) References Cited

U.S. PATENT DOCUMENTS 7,410,869 B2   8/2008   Leam et al.

FOREIGN PATENT DOCUMENTS

KR    1020120066253    6/2012

*Primary Examiner* — Asok K Sarkar
(74) *Attorney, Agent, or Firm* — IP & T Group LLP (57) ABSTRACT

A method for fabricating a semiconductor device including a semiconductor substrate having a trench formed therein. A migration assist layer is formed in the trench and on the substrate. A buried layer in formed in the trench by migrating material from the migration assist layer and the semiconductor substrate.

20 Claims, 10 Drawing Sheets

METHOD FOR FABRICATING SEMICONDUCTOR DEVICE

CROSS-REFERENCE TO RELATED APPLICATIONS

The present application claims priority of Korean Patent Application No. 10-2012-0077779, filed on Jul. 17, 2012, which is incorporated herein by reference in its entirety.

BACKGROUND

1. Field

Exemplary embodiments of the present invention relate to a semiconductor, and more particularly, to a method for fabricating a semiconductor having a buried bit line included in a channel area of a vertical channel transistor.

2. Description of the Related Art

Most semiconductor devices include transistors. For example, a memory cell of a memory device such as DRAM, includes a cell transistor such as a metal oxide semiconductor field-effect transistor (MOSFET). In general, the MOSFET forms a source/drain area in a semiconductor substrate, and a planar channel is formed between the source area and the drain area. Such a MOSFET is referred to as a planar channel transistor.

As the degree of integration and performance of semiconductor devices has continuously evolved, the fabrication technology of the MOSFET is approaching its physical limit. For example, with the decrease in the size of memory cells, the size of the MOSFET is reduced. Thus, the channel length of the MOSFET is also reduced. When the channel length of the MOSFET is reduced, the characteristics of the memory device may be degraded due to various problems. For example, data maintenance characteristics may be degraded.

In order to overcome the above-described problem, a vertical channel transistor has been proposed. The vertical channel transistor has a source area and a drain area that are formed over and under a pillar. Either one of the source area or the drain area is connected to a bit line. The bit line has a structure buried in the lower part of the vertical channel transistor. Such a bit line is referred to as a buried bit line.

The buried bit line is formed by a one-side-contact (OSC) process, in which a plurality of bodies, isolated by trenches, are formed in a substrate, air opening is formed to open one sidewall of each body, a bit line is formed to fill a part of the trench, and the body and the bit line are connected through the opening.

However, with a high degree of integration, a parasitic capacitance $C_B$ between adjacent buried bit lines may increase. The parasitic capacitance between buried bit lines substantially corresponds to capacitance between a body and a buried bit line, because the buried bit line is contacted with the body. Therefore, since the distance between adjacent buried bit lines is small, the parasitic capacitance becomes very high.

Thus, when the parasitic capacitance between the buried bit lines increases, the semiconductor device may not be operated. Therefore, the parasitic capacitance needs to be minimized by increasing the distance between buried bit lines.

SUMMARY

An embodiment of the present invention is directed to a method for fabricating a semiconductor device, which is capable of reducing parasitic capacitance between buried bit lines.

In accordance with an embodiment of the present invention, a method for fabricating a semiconductor device includes: forming a trench in a semiconductor substrate; forming an insulating layer over a surface of the substrate that defines the trench; forming a conductive pattern over the insulating layer such that the conducive patterns fills a part of the trench; removing a portion of the insulating layer exposed by the conductive pattern to expose a portion of the surface of the substrate that defines the trench; forming a migration assist layer along the entire surface of the resultant structure that the portion insulating layer is removed; and forming a buried layer in the trench via migrating material from the migration assist layer and the semiconductor substrate.

In accordance with another embodiment of the present invention, a method for fabricating a semiconductor device includes: forming a trench in a silicon substrate; forming an insulating layer on a surface of the substrate that defines the trench; forming a bit line over the insulating layer such that the bit line partially fills a part of the trench; forming a first silicon-containing layer over the bit line; removing a portion of the insulating layer exposed by the first silicon-containing layer to expose a portion of the surface of the substrate that defines the trench; forming a second silicon-containing layer along the entire surface of the resultant structure that the portion insulating layer is removed; forming, in the trench, a third silicon-containing layer via migrating material from the second silicon-containing layer and the substrate; forming a body line having the bit line buried therein by etching the second silicon-containing layer and the silicon substrate; and etching the body line to form a pillar including a channel area of a vertical channel transistor.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1:
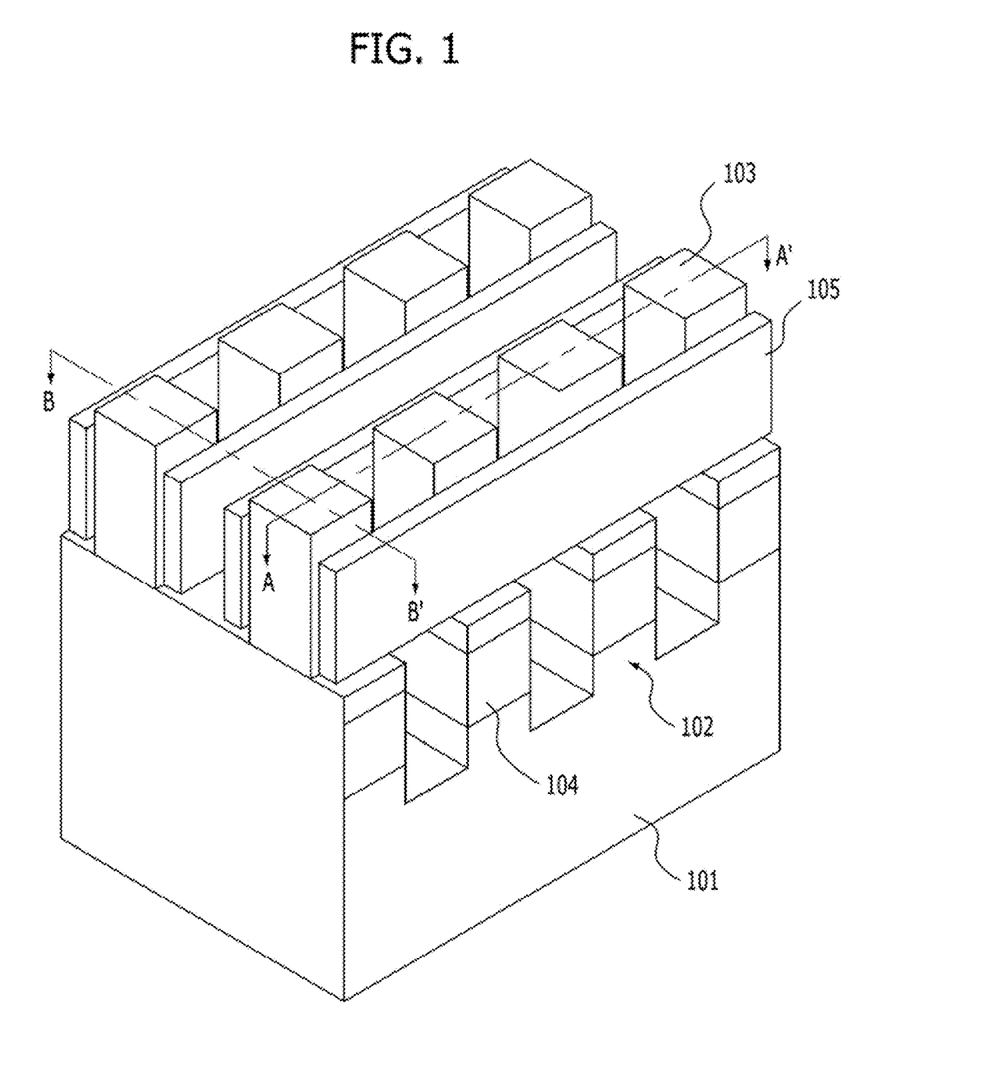
FIG. 1 is a perspective view of a semiconductor device in accordance with an embodiment of the present invention.

FIG. 1 is a perspective view of a semiconductor device in accordance with an embodiment of the present invention.

Referring to FIG. 1, the semiconductor device includes buried bit lines 104, pillars 103, and word lines 105. A plurality of bodies 102 and pillars 103 are formed over a semiconductor substrate 101, so that each of the pillars 103 is formed over a corresponding one of the plurality of bodies 102. The plurality of bodies 102 each has a linear shape and is formed to extend in a direction that is parallel to a surface of the semiconductor substrate 101. Each of the plurality of bodies 102 is isolated from one another. Each of the plurality of bodies 102 may extend in a first direction perpendicular to the surface of the semiconductor substrate 101, and the pillars 103 may be formed on the plurality of bodies 102 and may extend in a second direction that is perpendicular to the first direction. For example, the plurality of bodies 102 may be arranged in a first direction along a horizontal axis of the semiconductor substrate 101, and the pillars 103 may be arranged, on corresponding ones of the plurality of bodies 102, in a second direction perpendicular to the first direction. The pillars 103 are formed separately and may have a matrix array arrangement.

The semiconductor substrate 101 may include a silicon-containing material. For example, the semiconductor substrate 101 may include a single-crystalline silicon substrate. Since the plurality of bodies 102, the pillars 103, and the semiconductor substrate 101 may include the same material, the plurality of bodies 102 and the pillars 103 may include a silicon-containing material. For example, the plurality of bodies 102 and the pillars 103 may include single crystalline silicon.

Each of the pillars 103 has a structure in which a source/drain area and a channel area for a vertical channel transistor may be formed. For example, each of the pillars 103 may include a source area, a drain area, and a vertical channel area. Either one of the source area or the drain area may be connected to one of the buried bit lines 104. The other one of the source area or the drain area may be connected to a capacitor. The source area, the vertical channel area, and the drain area may be connected in a direction perpendicular to the surface of the substrate. The source area, the vertical channel area, and the drain area may form an NPN junction or PNP junction. For example, when the source area and the drain area are doped with a first type of impurity, the vertical channel ea may be doped with a second type of impurity that is different than the first type of impurity. For example, when the first type of impurity is an N-type impurity, then the second type of impurity may include a P-type impurity. On the other hand, when the first type of impurity is a P-type impurity, then the second type of impurity may include a N-type impurity. When the vertical channel transistor is an NMOSFET, the source area, the vertical channel area, and the drain area may form an NPN junction.

The buried bit lines 104 are formed on the body 102. The buried bit lines 104 may extend in a first direction. The buried bit lines 104 may include a metallic material. The buried bit lines 104 may include a metal or metal silicide. Accordingly, the buried bit lines 104 have low resistance. Adjacent buried bit lines 104 are isolated by an interlayer dielectric layer (not illustrated).

The word lines 105 are vertically formed on sidewalls of the pillars 103, the word lines 105 are referred to as vertical word lines. Since the word lines 105 may be formed on both sidewalls of the pillars 103, the semiconductor device may have a double word line structure. Although the semiconductor device may have a double word line structure, ends of the respective word lines may be connected to each other.

As discussed above, each of the pillars 103 includes a vertical channel area. Therefore vertical channels are formed by the pillars 103 and the word lines 105. Accordingly, a vertical channel transistor, including the word line 105, the source area, the vertical channel area, and the drain area is formed. The word line 105 may extend along a second direction crossing the first direction (i.e., extension direction of the buried bit line). The word line 105 includes a metallic material. For example, the word line 105 may include titanium nitride (TiN) or a stacked structure of tungsten nitride and tungsten (WN/W). The word line 105 and a buried bit line 104 may be spaced apart from each other. For this structure, an insulating layer (not illustrated) may be formed between the word line 105 and the buried bit line 104. For example the insulating layer may include a silicon oxide layer. In another embodiment, the word lines 105 may extend along the second direction crossing the first direction (i.e., extension direction of the buried bit line), while surrounding the sidewalls of the pillars 103.

FIGS. 2A to 2I are cross-sectional views illustrating a method for fabricating the semiconductor device in accordance with the embodiment of the present invention. FIGS. 2A to 2I are cross-sectional views taken along the line A-A' of FIG. 1.

Figure 2A:
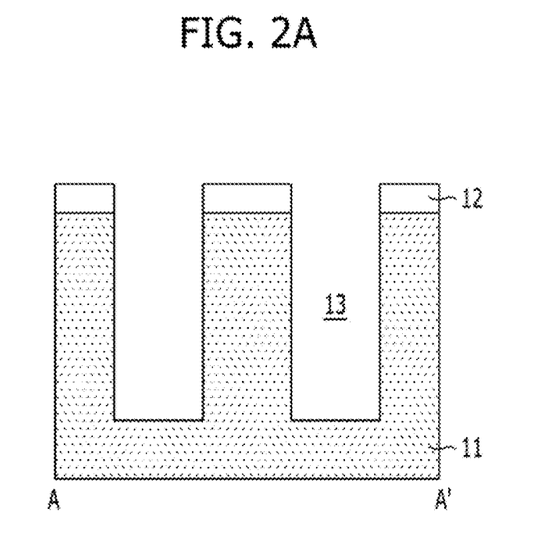
FIGS. 2A to 2I are cross-sectional views illustrating a method for fabricating the semiconductor device in accordance with the embodiment of the present invention.

Referring to FIG. 2A, a first hard mask pattern 12 is formed over a semiconductor substrate 11. The semiconductor substrate 11 may include a single crystalline material, such as single crystalline silicon.

The first hard mask pattern 12 may have a single layer of silicon oxide or silicon nitride or may have a stacked layer of silicon oxide and silicon nitride. For example, the first hard mask pattern 12 may include silicon nitride and silicon oxide which are sequentially stacked. Furthermore, the first hard mask pattern 12 may include silicon nitride, silicon oxide, silicon oxynitride, and amorphous carbon, which are sequentially stacked. When the first hard mask pattern 12 includes silicon nitride, a pad oxide layer may be further formed between the semiconductor substrate 11 and the first hard mask pattern 12. The first hard mask pattern 12 may include a line pattern extended in the first direction.

Using the first hard mask pattern 12 as an etch mask, a trench etch process is performed. For example, using the first hard mask pattern 12 as an etch barrier, the semiconductor substrate 11 is etched to a predetermined depth to form a first trench 13. The trench etch process may include an anisotropic etch process. The depth of the first trench 13 may be adjusted by considering a buried bit line and a channel area. For example, the first trench 13 may be formed to a depth of 500 Å to 3,000 Å.

Figure 2B:
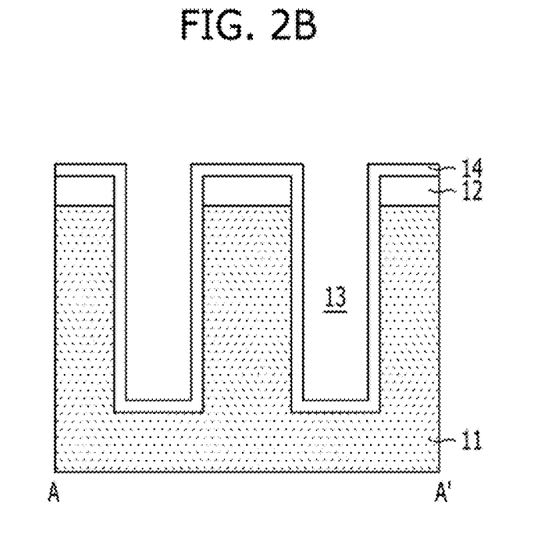

Referring to FIG. 2B, an insulating layer 14 is formed over the first hard mask pattern 12 and over a surface that defines the first trench 13. The insulating layer 14 serves to insulate a subsequently formed bit line 15A from the semiconductor substrate 11, and may be formed of an oxide, such as silicon oxide, for example. The insulating layer 14 may be formed by oxidizing sidewalls and floor of the first trench 13. Furthermore, the insulating layer 14 may be formed through a deposition method. The insulating layer 14 is formed to a thickness at which the bit line 15A and the semiconductor substrate 11 are sufficiently insulated from each other. For example, the insulating layer 14 may be formed to a thickness of 20 Å to 100 Å.

Figure 2C:
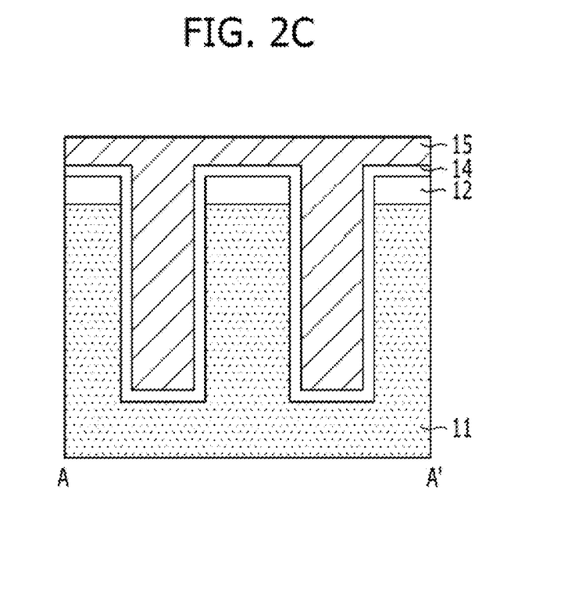

Referring to FIG. 2C, a first conductive layer 15 is formed over the insulating layer 14 to fill the first trench 13. The first conductive layer 15 is formed of a low-resistance material. For example, the first conductive layer 5 may include a metallic layer. The metallic layer may include Ti, W or a metal layer including Ti or W.

Figure 2D:
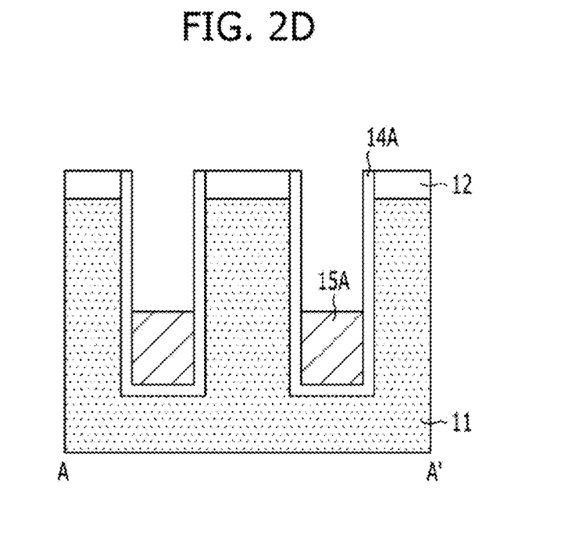

Referring to FIG. 2D, the first conductive layer 15 is etched to form a conductive pattern 15A to partially fill the first trench 13. The conductive pattern 15A may include a bit line. Hereafter, the conductive pattern 15A is referred to as a bit line 15A.

In order to partially fill the first trench 13 with the bit line 15A, the first conductive layer 15 may be selectively etched and recessed, using, for example, an etch-back process.

During the etch-back process, a portion of the insulating layer 14, formed over the first hard mask pattern 12, is removed. Thus, an insulating layer 14A remains on the sidewalls and the floor of the first trench 13 and on sidewalls of the first hard mask pattern 12.

Figure 2E:
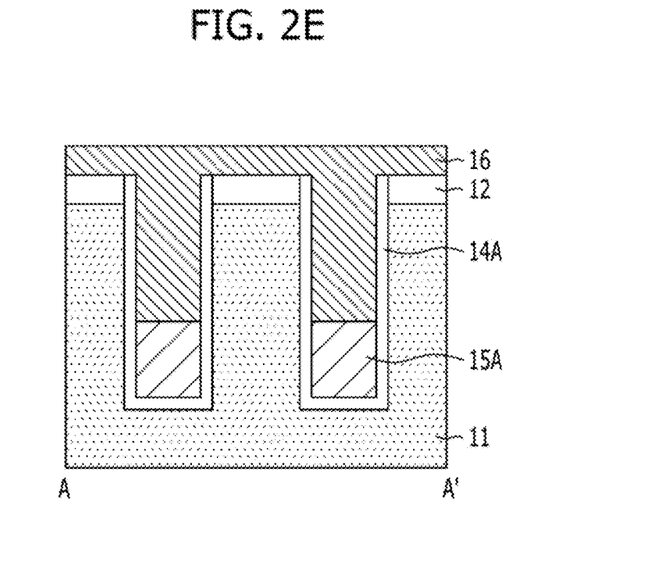

Referring to FIG. 2E, a second conductive layer 16 is formed over the bit line 15A. The second conductive layer 16 serves to prevent a defect of a buried layer and to protect the bit line.

The second conductive layer 16 may include a silicon-containing material, such as an undoped polysilicon or a doped polysilicon. The doped polysilicon may include polysilicon doped with a N-type impurity, such as phosphorus (P) or arsenic (As). Furthermore, the impurity of the doped polysilicon may have a concentration of about $1 \times 10^{20}$ atoms/cm$^3$ to about $1 \times 10^{21}$ atoms/cm$^3$.

Figure 2F:
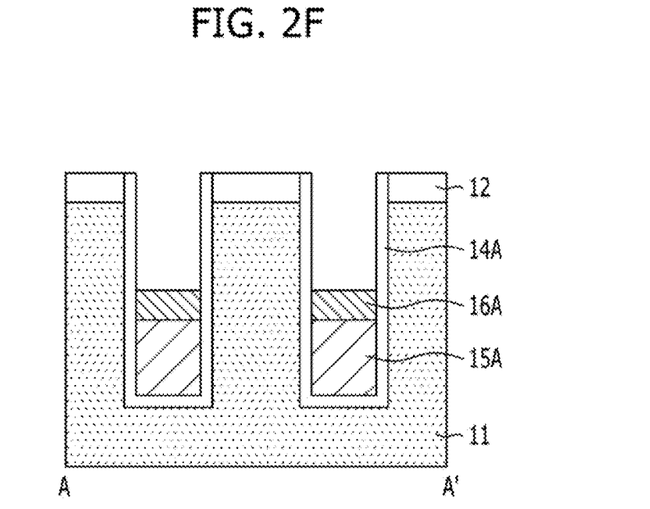

Referring to FIG. 2F, a second conductive layer pattern 16A is formed to fill the first trench 13. The second conductive layer pattern 16A serves to prevent a defect of a buried layer formed at the interface with the bit line 15A. Hereafter, the second conductive layer pattern 16A is referred to as a defect prevention layer 16A. The defect prevention layer 16A may serve to not only prevent a defect of the buried layer, but also protect the bit line 15A during a subsequent thermal process. The process for forming the defect prevention layer 16A may be performed by dry etching.

Figure 2G:
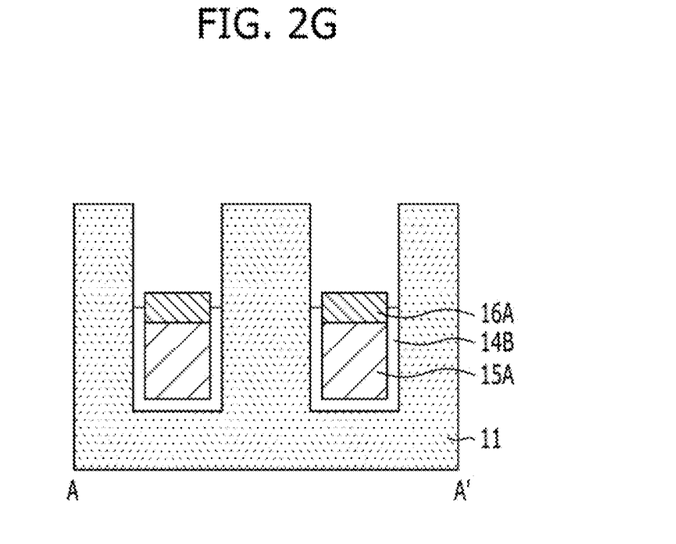

Referring to FIG. 2G, an exposed portion of the insulating layer 14A is removed from the sidewalls of the first trench 13. The process of removing the exposed insulating layer 14A may be performed by wet etching. Hereafter, the etched insulating layer is referred to as an insulating layer pattern 14B. Then, the first hard mask pattern 12 is removed to expose top portions of the substrate 11.

The insulating layer pattern 14B may be formed so that a top portion of the insulating layer pattern 14B is at a height of the defect prevention layer 16A, but is lower than a height of a top surface of the defect prevention layer 16A. Furthermore, the top portion of the insulating layer pattern 14B is exposed between the defect prevention layer 16A and the first trench 13.

Figure 3:
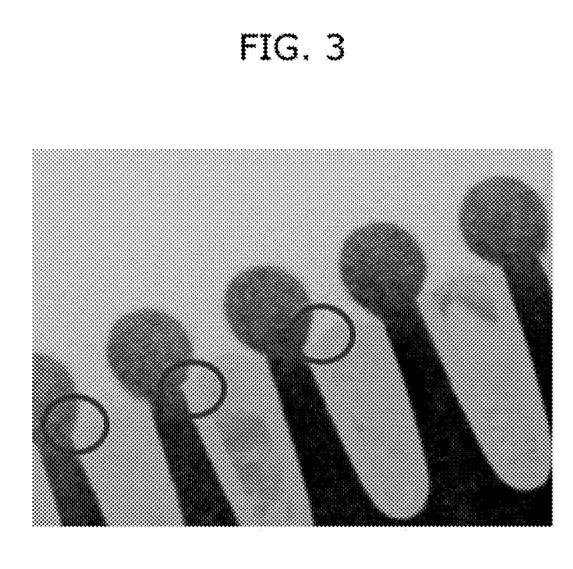
FIGS. 3 and 4 are TEM photographs showing a problem when migration is attempted in accordance with a comparative embodiment.
Figure 4:
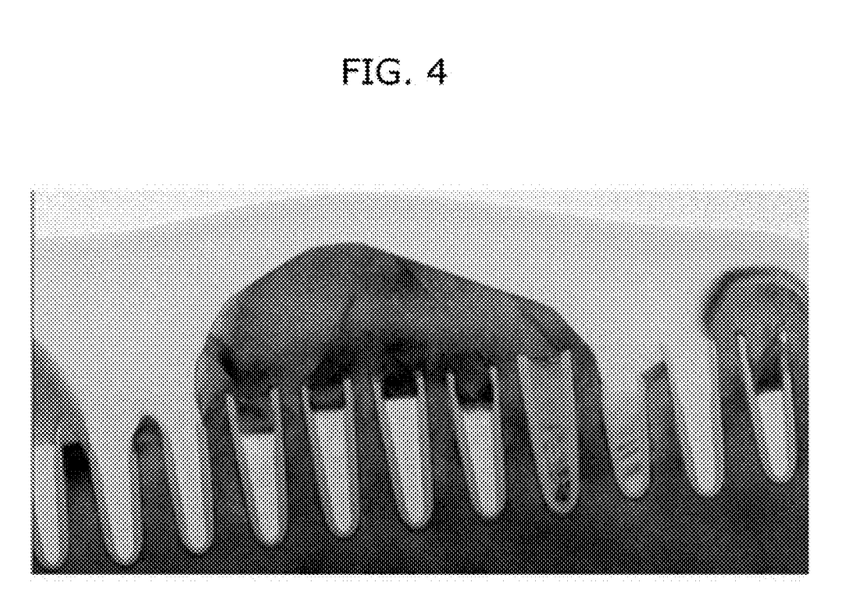

Attempting to perform migration when the top portion of the insulating layer pattern 14B is exposed will result in a failure to perform migration due to the insulating layer pattern 14B being formed of oxide. FIGS. 3 and 4 are TEM photographs showing a problem when migration is attempted in accordance with a comparative embodiment.

Referring to FIG. 3, when migration is attempted when an insulating layer is exposed between trench sidewalls and a bit line, a flow process may not be performed. FIG. 4 shows that agglomeration may occur when the flow process is not smoothly performed.

Therefore, the process needs to be controlled so as not to expose the insulating layer pattern 14B between the sidewalls of the first trench 13 and the defect prevention layer 16A.

Figure 2H:
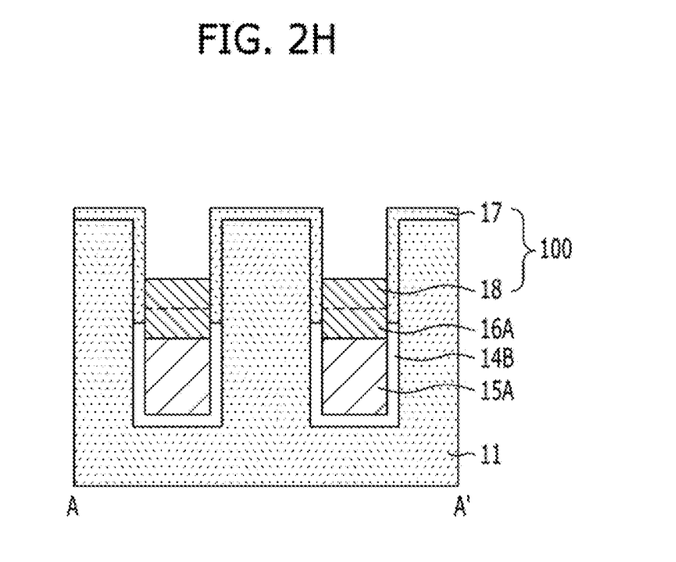

Referring to FIG. 2H, a migration assist layer 100 is formed on the sidewalls of the first trench 13 and on the semiconductor layer 11. The migration assist layer 100 may be formed by an epitaxial growth process, for example, a selective epitaxial growth process. The migration assist layer 100 may include single crystalline silicon and polysilicon. For example, a single crystalline silicon layer 17 may be formed on the surface of the semiconductor substrate 11, which is formed of single crystalline silicon, and a polysilicon layer 18 may be formed on the defect prevention layer 16A, which is formed of polysilicon.

The selective epitaxial growth process for forming the migration assist layer 100 may be performed under a hydrogen ($H_2$) or nitrogen ($N_2$) atmosphere.

The migration assist layer 100 prevents the insulating layer pattern 14B from being exposed between the defect prevention layer 16A and the sidewalls of the first trench 13. Therefore, a flow process may be smoothly performed during a subsequent migration process.

Figure 2I:
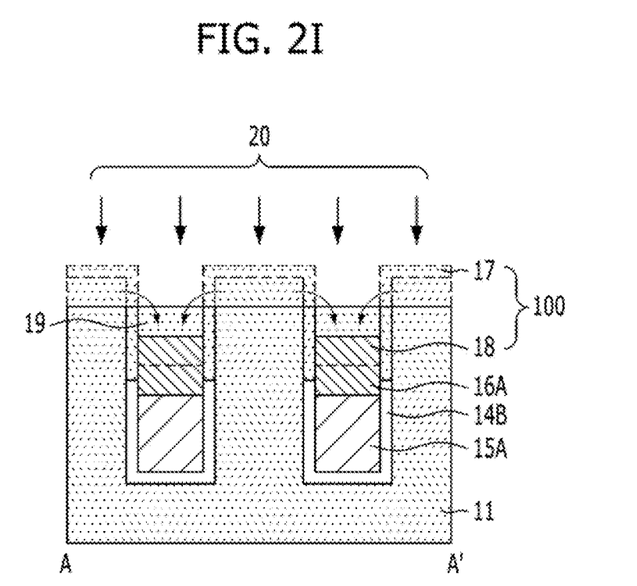

Referring to FIG. 2I, a process of migrating material from the semiconductor substrate 11 is performed to form a buried layer 19 to fill the other part of the first trench 13. At the same time, a process of migrating material from the migration assist layer 100, which is formed over the semiconductor substrate 11, may also be performed. The process of migrating material from the semiconductor substrate 11 and from the migration assist layer 100 may include a thermal process. The process of migrating material from the semiconductor substrate 11, which is formed of single crystalline silicon, via the thermal process is referred to as a silicon migration process. The buried layer 19 is formed of the same material as the semiconductor substrate 11, and includes silicon. For example, the buried layer 19 may include single crystalline silicon.

The silicon migration process is performed under a hydrogen ($H_2$) or nitrogen ($N_2$) atmosphere. In order to effectively perform the silicon migration process, a cleaning process to remove contaminants may be performed before the silicon migration. For example, a wet cleaning process and an $H_2$ bake process may be performed. Furthermore, $H_2$, or a mixture of $H_2$ and inert gas, may be used to perform the silicon migration process. The silicon migration process may be performed at a temperature of about 500° C. to about 1,100° C. and a pressure of about 0.1 Torr to about 760 Torr.

As such, when the silicon migration process is performed, a portion of the first trench 13 may be filled with the buried layer 19. During the silicon migration process, silicon migration may be promoted by a reduction reaction of $H_2$, and the first trench 13 may be filled by the silicon migration. As the height of the semiconductor substrate 11 is reduced by the silicon migration, the buried layer 19 is formed. As a result, the bit line 15A is buried in the semiconductor substrate 11.

Figure 5A:
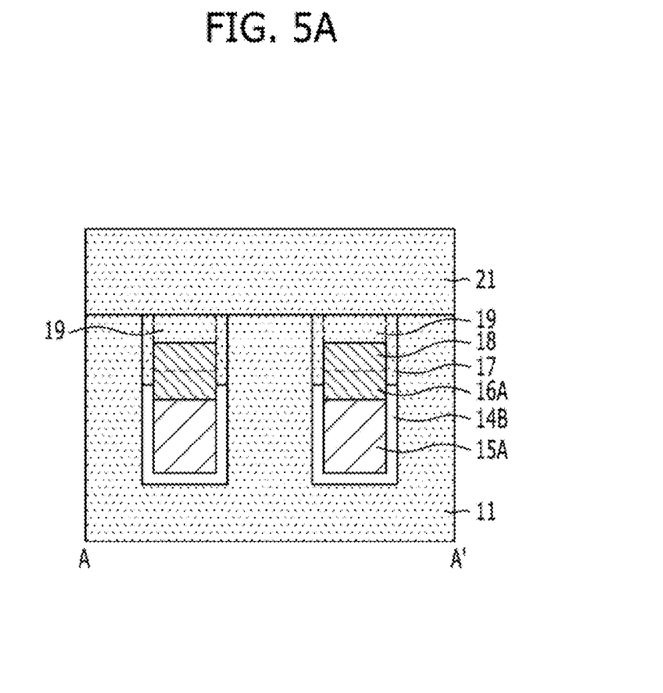
FIGS. 5A and 5B are cross-sectional views illustrating a process for forming a body line of the semiconductor substrate in accordance with the embodiment of the present invention.
Figure 5B:
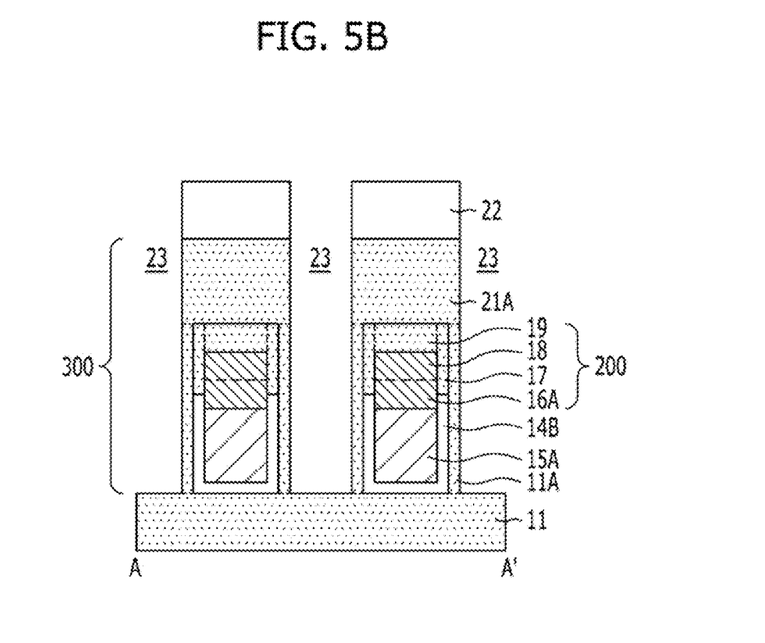

FIGS. 5A and 5B are cross-sectional views illustrating a process for forming a body line of the semiconductor substrate in accordance with the embodiment of the present invention. FIGS. 5A and 5B illustrate a process after the conductive pattern is buried in the substrate in FIG. 2I, and the same reference numerals are used, for convenience of description.

Referring to FIG. 5A, a third conductive layer 21 is formed over the semiconductor layer 11 which includes the buried layer 19. The third conductive layer 21 may include a silicon-containing material. The third conductive layer 21 may be formed through a selective epitaxial growth process. For example, the third conductive layer 21 may be formed of single crystalline silicon formed via the selective epitaxial growth process. Since the semiconductor substrate 11 and the buried layer 19, which are both formed of a single crystalline material, are positioned under the third conductive layer 21, the third conductive layer 21 may be grown with minimal defects.

When the third conductive layer 21 is grown, doping with an impurity may be performed. For example, an impurity may be in-situ doped, at the same time as the growth of the third conductive layer 21, thereby forming an NPN junction. Alternatively, the third conductive layer 21 may be formed of an undoped single crystalline silicon and an NPN junction may subsequently be formed through ion implantation. The semiconductor substrate 11 and the third conductive layer 21 may subsequently be etched to form a pillar. The pillar may be used as a channel of a vertical channel transistor.

Referring to FIG. 5B, a second hard mask pattern 22 is formed over the third conductive layer 21.

Using the second hard mask pattern 22 as an etch mask, the third conductive layer 21 is etched to form pillar areas 21A, where word lines will subsequently be formed. The semiconductor substrate 1 is partially etched to form second trenches 23. At this time, when the migration assist layer 100 is left over the semiconductor substrate 11, the migration assist layer 100 is etched together.

When the second trench 23 is formed, a critical dimension (CD) of the second hard mask pattern 22 may be adjusted to at least a larger value than a total CD of the bit line 15A and the insulating layer pattern 14B. Therefore, a protective layer 11A is left as a spacer on a sidewalls of the insulating layer pattern 14B. The protective layer 11A is a remaining portion of the etched semiconductor substrate 11, and serves to prevent the insulating layer pattern 14B from being exposed during the formation of the second trench 23.

The protective layer 11A may prevent the bit line 15A from being exposed when the insulating layer pattern 148 is exposed during the formation of the second trench 23. The protective layer 11A may also protect the bit line 15A during a subsequent cleaning process. Furthermore, protective layer 11A may prevent the bit line 15A from being exposed, when the etching process is performed along the sidewalls of the insulating layer pattern 14B, due to an improper etching margin.

Subsequently, an interlayer dielectric layer may be formed to fill the second trench 23.

A body line 300, including the bit line 15A, is formed in a lower portion of the channel area of the vertical channel transistor. The bit line 15A is buried in the body line 300. The body line 300 extends perpendicular from the surface of the semiconductor substrate 11. Furthermore, a plurality of silicon layers 200, which may include the defect prevention layer 16A, the migration assist layer 100, and the buried layer 19, are stacked over the bit line 15A. The plurality of silicon layers 200 in conjunction with a pillar area 21A, may be used as the channel area or junction area of the vertical channel transistor together.

FIGS. 6A to 6D are cross-sectional views illustrating a process for fabricating a word line of the semiconductor substrate in accordance with an embodiment of the present invention. FIGS. 6A to 6D illustrate a process after the body lines of FIG. 5B are formed. The same reference numerals are used for convenience of description. FIGS. 6A to 6D are cross-sectional views taken along the line B-B' of FIG. 1.

Figure 6A:
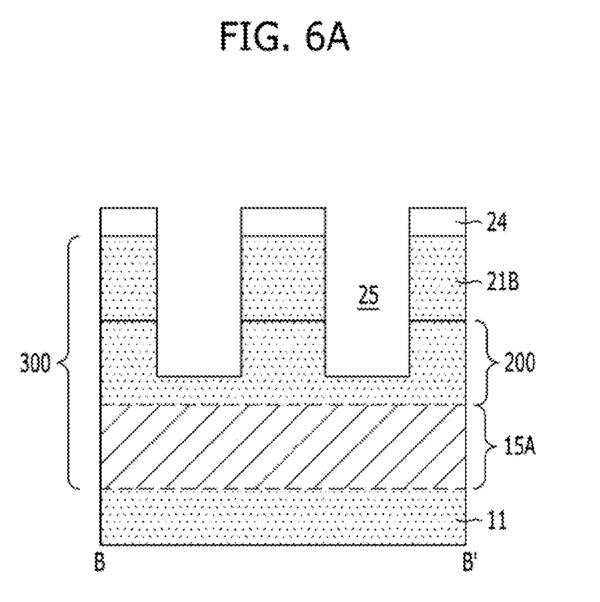
FIGS. 6A to 6D are cross-sectional views illustrating a process for fabricating a word line of the semiconductor substrate in accordance with the embodiment of the present invention.

Referring to FIG. 6A, the bit line 15A is formed in the semiconductor substrate 11, and the plurality of silicon layers 200 are stacked over the bit line 15A. Furthermore, the pillar areas 21A are formed over the semiconductor substrate 11 including the plurality of silicon layers 200.

Then, a third hard mask pattern 24 is formed over the pillar area 21A.

Using the third hard mask pattern 24 as an etch mask, the top of the body line 300, that is, the pillar areas 21A are etched to form a third trenches 25 the isolate the pillar areas 21 from one another. Accordingly, the pillar areas 21A, which are isolated by the third trenches 25, become pillars 21B. The pillars 21B extend from corresponding body lines 300, in a direction parallel to a direction of the body lines 300. A plurality of the pillars 21B may be formed on each body line 300. Each of the pillars 21B is associated with a corresponding memory cell. In order to form the third trenches 25, the plurality of silicon layers 200 may be etched in addition to the pillar areas 21A. The third trenches 25 may have such a depth as not to expose the bit lines 15A.

The pillars 21B are a structure where a source/drain area and a channel area of a vertical channel transistor are formed. The pillars 21B may have a matrix array arrangement.

Figure 6B:
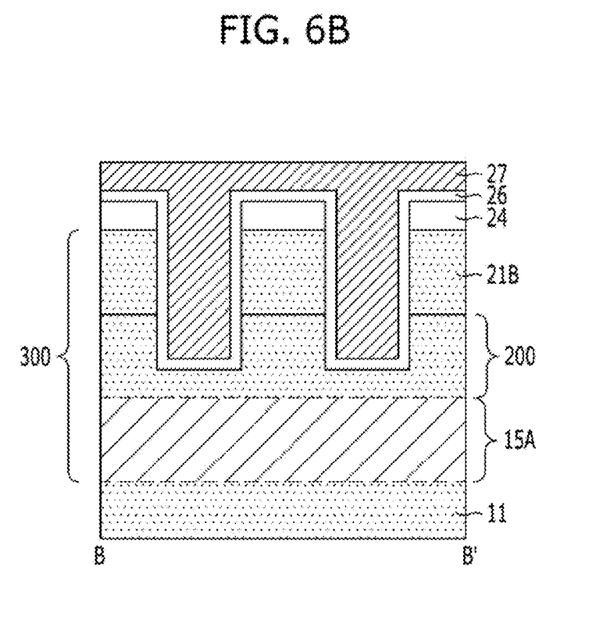

Referring to FIG. 6B, a gate dielectric layer 26 is formed on a surface of the third hard mask pattern 24 and a surface of the third trenches 25. The gate dielectric layer 26 may be formed by oxidizing sidewalls of the third trenches 25 and a the surface of the third hard mask pattern 24.

Then, a fourth conductive layer 27 is formed on the gate dielectric layer 26 to fill the third trenches 25. The fourth conductive layer 27 may be formed of a low-resistance material, such as titanium (Ti), titanium nitride (TiN), or tungsten (W).

Figure 6C:
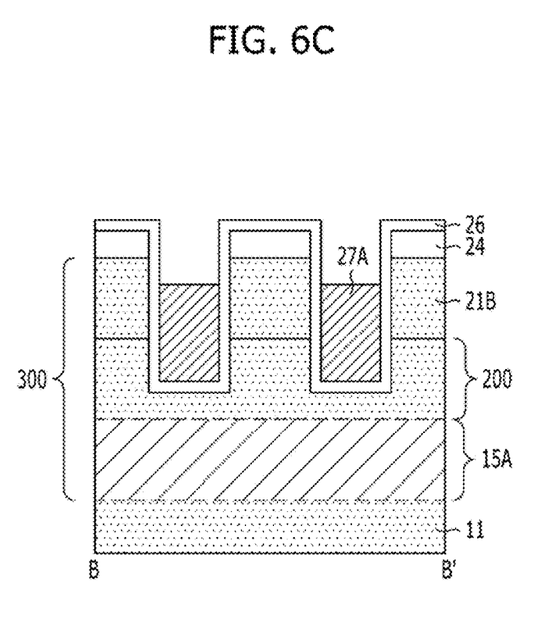

Referring to FIG. 6C, a planarization process and an etchback process are sequentially performed to form the recessed fourth conductive layer 27A.

Figure 6D:
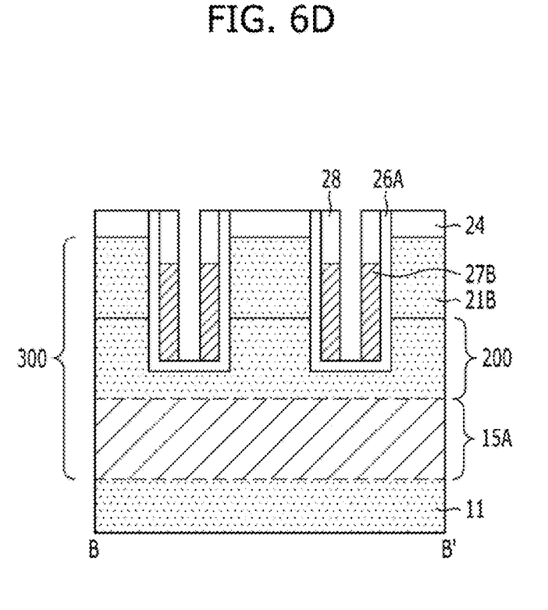

Referring to FIG. 6D, an insulating layer is deposited, and an etch-back process is then performed to form a spacer 28. The spacer 28 may include a nitride.

The fourth conductive layer 27A is etched, using the spacer 28 as an etch mask, to form a word line 27B on both sidewalls of each of the pillars 21B. In another embodiment, the word line 27B may be formed to surround the pillar 21B. In still another embodiment, after a ring-shaped vertical gate electrode may be formed to surround each of the pillars 21B and a word line 27B may be formed to connect adjacent vertical gate electrodes. The word lines 27B also serve as vertical gate electrode. The word lines 27B are formed in a direction crossing the bit lines 15A.

Although not illustrated, a storage node contact plug (SNC) may be formed to be connected to the top of each of the pillars 21B, and a capacitor may be formed over each of the SNCs. The capacitor includes a storage node. Each of the storage nodes may have a cylinder shape. In another embodiment, each of the storage nodes may have a pillar or concave shape. Although not illustrated, a dielectric layer and a top electrode are subsequently formed over the storage node.

In accordance with the embodiment of the present invention, the bit lines 15A are not buried in the trenches between the pillars, but rather, each of the bit lines 15A is formed to be contacted with the pillar 21B through the silicon layers 200. Therefore, it is possible to not only increase the integration degree but also reduce the parasitic capacitance between adjacent bit lines.

Furthermore, the migration assist layer 100 is formed on the sidewalls of the trench during the formation of the bit lines 15A, in order to improve the silicon migration process. Accordingly, it is possible to prevent silicon agglomeration.

The semiconductor device, in accordance with the embodiment of the present invention, may be included in a memory cell and a memory cell array. The bit line and the word line may store or output data based on a voltage applied by a column decoder and a row decoder that are connected to the memory cell array.

The memory cell array, in accordance with the embodiment of the present invention, may be included in a memory device. The memory device may include, for example, a memory cell array, a row decoder, a column decoder, or a sense amplifier. The row decoder may select, from among word lines of the memory cell array, a word line, corresponding to a particular memory cell that is to perform a read or write operation and to output a word line select signal to the semiconductor memory cell array. Furthermore, the column decoder may select, from among bit lines of the memory cell array, a bit line, corresponding to a memory cell that is to perform a read or write operation and to output a bit line select signal to the memory cell array. Furthermore the sense amplifier may sense data stored in the memory cell selected by the row decoder and the column decoder.

The semiconductor device, in accordance with the embodiment of the present invention, may be implemented in, for example, a dynamic random access memory (DRAM), a static random access memory (SRAM), a flash memory, a ferroelectric random access memory (FeRAM), magnetic random access memory (MRAM), or a phase change random access memory (PCRAM).

Other exemplary implementations of the semiconductor device of the present invention may include a graphic memory having various specifications, mobile memory for use in a mobile communication device, a memory for use in a desktop computer, a notebook computer, or a hardware-implemented server device. As further examples, the semiconductor device of the present invention may be implemented in a portable storage media, such as memory stick, a multi-media card (MMC), a secure digital (SD) card, a CompactFlash (CF) card, an ExtremeDigital (xD) card, a picture card, or a USB flash device. The semiconductor device of the present invention may also be implemented, for example, invarious digital applications such as MP3 portable media player (PMP), a digital camera, a camcorder, or a mobile phone. Furthermore, the semiconductor device of the present invention may also be implemented in a multi-chip package (MCP), a disk on chip (DOC), or an embedded device. Furthermore, the semiconductor device of the present invention may also be implemented in a CMOS image sensor (CIS).

It is noted that the above-discussed list of implementations, of the semiconductor device of the present invention, is merely for the purpose of example, and is not intended to be exhaustive or to be in any way limiting regarding other implementations of the present invention.

In an exemplary implementation, the memory device, in accordance with the embodiment of the present invention, may be used in a memory module. The memory module may include a plurality of memory devices, a command link, or a data line. The plurality of memory devices may be mounted on a module substrate. The command link may transfer control signals (address signal, command signal, and clock signal) from an external controller to the memory devices. The data link may be connected to the memory device and may transmit data. The command link and the data link may be formed in the same manner as or a similar manner as those used to form a typical semiconductor module. The memory module may, for example, include eight memory devices mounted on a front surface of the module substrate and the same number of memory devices mounted on a rear surface of the module substrate. That is, the memory devices may be mounted in one side or both sides of the module substrate, and the number of memory devices to be mounted is not limited. Furthermore, the material and structure of the module substrate are not limited specifically.

The memory module, in accordance with the embodiment of the present invention, may be used in a memory system. The memory system may include one or more memory modules having a plurality of memory devices mounted therein and a controller to provide a bidirectional interface between the memory modules and an external system and to control an operation of the memory modules.

The memory system, in accordance with the embodiment of the present invention, may be used in an electronic unit. The electronic unit may include a memory system and a processor electrically connected to the memory system. Here, the processor may include a central processing unit (CPU), a micro processor unit (MPU), a micro controller unit (MCU), a graphics processing unit (GPU), or a digital signal process (DSP). Here, the CPU or the MPU may combine an arithmetic logic unit (ALU) and a control unit (CU) to read and to analyze a command to control respective units. When the processor is a CPU or a MPU, the electronic unit may include a computer or mobile device. Furthermore, the GPU may calculate numbers having a decimal point and implement graphics in real time. When the processor is the GPU, the electronic unit may include a graphic device. Furthermore, the DSP refers to a processor that converts an analog signal (for example, voice) into a digital signal, or converts a digital signal into an analog signal, at high speed and uses the conversion result. The DSP mainly calculates a digital value. When the processor is the DSP, the electronic unit may include a sound and imaging device. In addition, the processor may include an accelerator processor unit serving as a graphic card.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a trench in a semiconductor substrate;
   forming an insulating layer over a surface of the substrate that defines the trench;
   forming a conductive pattern over the insulating layer such that the conducive pattern fills a part of the trench;
   removing a portion of the insulating layer from sidewalls of the trench above the conductive pattern;
   forming a migration assist layer along the entire surface of the resultant structure that the portion of the insulating layer is removed; and
   forming a buried layer in the trench via migrating material from the migration assist layer and the semiconductor substrate.

2. The method of claim 1, wherein the migration assist layer comprises a silicon layer.

3. The method of claim 1, wherein the forming of the migration assist layer comprises:
   performing an epitaxial growth process.

4. The method of claim 3, wherein the performing of the epitaxial growth process is performed under a hydrogen ($H_2$) or a nitrogen ($N_2$) atmosphere.

5. The method of claim 1, wherein removing the portion of the insulating layer comprises:
   etching the portion of the insulating layer.

6. The method of claim 1, further comprising:
forming a defect prevention layer over the conductive pattern, before the portion of the insulating layer is removed.

7. The method of claim 6, wherein the defect prevention layer comprises a polysilicon layer.

8. The method of claim 1, wherein the semiconductor substrate comprises a silicon substrate.

9. The method of claim 8, wherein the migrating material from the migration assist layer and the semiconductor substrate to form the buried layer comprises
migrating material from the migration assist layer and the semiconductor substrate using a thermal process performed in a hydrogen ($H_2$) or a nitrogen ($N_2$) atmosphere.

10. The method of claim 1, wherein the conductive pattern comprises a metal layer.

11. A method for fabricating a semiconductor device, the method comprising:
forming a trench in a silicon substrate;
forming an insulating layer on a surface of the substrate that defines the trench;
forming a bit line over the insulating layer such that the bit line partially fills a part of the trench;
forming a first silicon-containing layer over the bit line;
removing a portion of the insulating layer from sidewalls of the trench above the first silicon-containing layer;
forming a second silicon-containing layer along the entire surface of the resultant structure that the portion of the insulating layer is removed;
forming, in the trench, a third silicon-containing layer via migrating material from the second silicon-containing layer and the substrate;
forming a body line having the bit line buried therein by etching the second silicon-containing layer and the silicon substrate; and
etching the body line to form a pillar including a channel area of a vertical channel transistor.

12. The method of claim 11, wherein the first silicon-containing layer comprises a polysilicon layer.

13. The method of claim 11, wherein the second silicon-containing layer and the third silicon-containing layer comprise single crystalline silicon layers.

14. The method of claim 11, wherein the forming of the second silicon-containing layer comprises:
performing an epitaxial growth process.

15. The method of claim 14, wherein the performing of the epitaxial growth process is performed under a hydrogen ($H_2$) or a nitrogen ($N_2$) atmosphere.

16. The method of claim 11, wherein removing the portion of the insulating layer comprises:
etching the portion of the insulating layer.

17. The method of claim 11, wherein the migrating material from the second silicon-containing layer and the substrate comprises:
migrating material from the second silicon-containing layer and the substrate using a thermal process performed in a hydrogen ($H_2$) or a nitrogen ($N_2$) atmosphere.

18. The method of claim 11, further comprising:
forming, before the forming of the body line, a fourth silicon-containing layer over the third silicon-containing layer and over the silicon substrate.

19. The method of claim 18, wherein the fourth silicon-containing layer comprises single crystalline silicon layer.

20. The method of claim 11, wherein the bit line comprises a conductive layer.

* * * * *